(12) United States Patent  
Kashiwagi

(10) Patent No.: US 7,588,967 B2
(45) Date of Patent: Sep. 15, 2009

(54) CURABLE SILICONE RUBBER COMPOSITION AND SEMICONDUCTOR DEVICE

(75) Inventor: Tsutomu Kashiwagi, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 44 days.

(21) Appl. No.: 11/419,629

(22) Filed: May 22, 2006

(65) Prior Publication Data

US 2006/0270792 A1  Nov. 30, 2006

(30) Foreign Application Priority Data

May 27, 2005 (JP) .............................. 2005-155797

(51) Int. Cl.
H01L 21/56 (2006.01)
C08G 77/20 (2006.01)
C08G 77/04 (2006.01)

(52) U.S. Cl. ........................... 438/127; 528/16; 528/32; 528/37

(58) Field of Classification Search ............... 524/861, 524/862, 863; 528/16
See application file for complete search history.

(56) References Cited

U.S. PATENT DOCUMENTS

| | | | | |
|---|---|---|---|---|
| 3,517,001 A | * | 6/1970 | Berger | 544/221 |
| 4,082,719 A | * | 4/1978 | Liles et al. | 523/435 |
| 4,364,809 A | * | 12/1982 | Sato et al. | 522/60 |
| 4,427,801 A | * | 1/1984 | Sweet | 523/212 |
| 4,533,503 A | * | 8/1985 | Wengrovius | 556/173 |
| 4,665,127 A | * | 5/1987 | Hirose et al. | 525/100 |
| 4,721,764 A | * | 1/1988 | Fujiki et al. | 528/15 |
| 4,742,103 A | * | 5/1988 | Morita et al. | 524/174 |
| 4,770,942 A | * | 9/1988 | Itoh et al. | 428/447 |
| 5,082,706 A | * | 1/1992 | Tangney | 428/40.7 |
| 5,120,810 A | * | 6/1992 | Fujiki et al. | 528/15 |
| 5,164,461 A | * | 11/1992 | Mitchell et al. | 525/478 |
| 5,312,855 A | * | 5/1994 | Okami | 524/290 |
| 5,360,858 A | * | 11/1994 | Fujiki et al. | 524/434 |
| 5,364,921 A | * | 11/1994 | Gray et al. | 528/15 |
| 5,432,280 A | * | 7/1995 | Hara et al. | 524/730 |
| 5,486,578 A | * | 1/1996 | Carpenter et al. | 525/478 |
| 5,585,445 A | * | 12/1996 | Meguriya et al. | 525/476 |
| 5,595,826 A | * | 1/1997 | Gray et al. | 428/450 |
| 5,610,213 A | * | 3/1997 | Sumpter et al. | 524/267 |
| 5,616,632 A | * | 4/1997 | Fujiki et al. | 523/211 |
| 5,668,205 A | * | 9/1997 | Yoshida et al. | 524/268 |
| 5,674,966 A | * | 10/1997 | McDermott et al. | 528/32 |
| 5,756,598 A | * | 5/1998 | Chung et al. | 525/478 |
| 5,777,047 A | * | 7/1998 | Chung et al. | 525/478 |
| 5,962,127 A | * | 10/1999 | Maxson | 428/332 |

(Continued)

FOREIGN PATENT DOCUMENTS

JP  2003-174059  6/2003

*Primary Examiner*—Randy Gulakowski
*Assistant Examiner*—Robert Loewe
(74) *Attorney, Agent, or Firm*—Oblon, Spivak, McClelland, Maier & Neustadt, L.L.P.

(57) ABSTRACT

A curable silicone rubber composition comprising (A) a vinyl-containing organopolysiloxane, (B) an organohydrogenpolysiloxane, (C) an aluminum chelate catalyst, (D) a platinum catalyst, and (E) a tackifier establishes a sufficient bond strength to packaging materials including difficult-to-bond thermoplastic resins such as polyphthalamide resins and liquid crystal polymers and to electrodes of metals such as Ag, Au, Ni and Pd, and forms a transparent cured part. A semiconductor device encapsulated with the cured composition is reliable.

19 Claims, 1 Drawing Sheet

U.S. PATENT DOCUMENTS

| | | | |
|---|---|---|---|
| 5,981,682 A * | 11/1999 | Onishi | 528/31 |
| 6,040,361 A * | 3/2000 | Fujiki et al. | 523/209 |
| 6,201,092 B1 * | 3/2001 | Hara | 528/15 |
| 6,509,423 B1 * | 1/2003 | Zhu | 525/478 |
| 6,703,120 B1 * | 3/2004 | Ko et al. | 428/355 R |
| 6,906,161 B2 * | 6/2005 | Sakamoto et al. | 528/35 |
| 2003/0130410 A1 * | 7/2003 | Itagaki et al. | 524/547 |
| 2003/0211340 A1 * | 11/2003 | Ikeno et al. | 428/447 |
| 2004/0096673 A1 * | 5/2004 | Aketa et al. | 428/447 |
| 2004/0127636 A1 * | 7/2004 | Yamamoto et al. | 524/588 |
| 2004/0152858 A1 * | 8/2004 | Kamohara et al. | 528/25 |
| 2004/0219785 A1 * | 11/2004 | Itagaki et al. | 438/660 |
| 2004/0222618 A1 * | 11/2004 | Azechi et al. | 280/728.1 |
| 2005/0006794 A1 * | 1/2005 | Kashiwagi et al. | 257/788 |
| 2005/0038183 A1 * | 2/2005 | Ahn et al. | 524/861 |
| 2005/0054762 A1 * | 3/2005 | Yaginuma et al. | 524/492 |
| 2005/0129957 A1 * | 6/2005 | Kashiwagi et al. | 428/413 |
| 2005/0239958 A1 * | 10/2005 | Bublewitz et al. | 524/862 |
| 2005/0282959 A1 * | 12/2005 | Ahn et al. | 524/861 |
| 2006/0177673 A1 * | 8/2006 | Ikeno et al. | 428/447 |
| 2007/0009748 A1 * | 1/2007 | Takanami et al. | 428/447 |
| 2007/0026244 A1 * | 2/2007 | Budden et al. | 428/447 |

* cited by examiner

US 7,588,967 B2

CURABLE SILICONE RUBBER COMPOSITION AND SEMICONDUCTOR DEVICE

CROSS-REFERENCE TO RELATED APPLICATION

This non-provisional application claims priority under 35 U.S.C. §119(a) on Patent Application No. 2005-155797 filed in Japan on May 27, 2005, the entire contents of which are hereby incorporated by reference.

TECHNICAL FIELD

This invention relates to an addition cure type silicone rubber composition, and more particularly, to a curable silicone rubber composition which is fully adherent to thermoplastic resins such as polyphthalamide resins (PPA) and liquid crystal polymers (LCP) and electrodes of noble metals such as silver and gold.

BACKGROUND ART

Silicone rubber compositions are used in a wide variety of applications because they form cured products featuring the favorable properties of weathering and heat resistance and excellent rubbery properties such as hardness and elongation.

In the semiconductor packaging art, polyphthalamide resins (PPA) and liquid crystal polymers (LCP), which are thermoplastic resins having excellent heat resistance, have recently been under study on their use as packaging materials. Lead frames and electrodes are generally made of metals including Ag, Au, Ni, Pd and the like, which are rather difficult to bond to resins. The soldering technology associated with packages using these materials has changed to lead-free high-temperature solders. Many troubles arise from high-temperature stress, thermal cycling, and hot humid storage, for example, separation readily occurs at the interface between packages and silicone resins.

For addition cure type silicone rubber compositions, it is a common practice to add silane coupling agents to improve adhesion. Since reaction does not proceed to the completion, these compositions allow separation to occur in a test under rigorous conditions. If intense reaction takes place, the compositions discolor or turn opaque and cannot be used in optical applications.

Reference should be made to JP-A 2003-174059 and JP-A 2002-338833.

DISCLOSURE OF THE INVENTION

An object of the present invention is to provide a curable silicone rubber composition which establishes a sufficient bond strength to packaging materials including difficult-to-bond thermoplastic resins such as polyphthalamide resins (PPA) and liquid crystal polymers (LCP) and to electrodes of metals such as Ag, Au, Ni and Pd, and forms a transparent cured part; and a semiconductor device encapsulated with the cured composition.

The inventor has found that a curable silicone rubber composition comprising (A) a vinyl-containing organopolysiloxane, (B) an organohydrogenpolysiloxane, (C) an aluminum metal based polymerization catalyst, (D) a platinum group metal based catalyst, and (E) a tackifier establishes a sufficient bond strength to substrates which are otherwise difficult to bond, including packaging materials comprising thermoplastic resins such as PPA and LCP and electrodes of metals such as Ag, Au, Ni and Pd, and forms a transparent cured part, and that a semiconductor device encapsulated with the cured composition is improved in reliability.

Accordingly, the present invention provides a curable silicone rubber composition comprising (A) a vinyl-containing organopolysiloxane, (B) an organohydrogenpolysiloxane, (C) an aluminum metal based polymerization catalyst, (D) a platinum group metal based catalyst, and (E) a tackifier. A typical aluminum metal based polymerization catalyst (C) is an aluminum chelate catalyst. The tackifier (E) may be any known adhesive aid such as an organoxysilyl-modified isocyanurate compound and/or a hydrolytic condensate thereof (organosiloxane-modified isocyanurate compound) or an epoxy-containing silane coupling agent. Also contemplated herein is a semiconductor device encapsulated with the composition in the cured state.

BENEFITS OF THE INVENTION

The curable silicone rubber composition of the invention is fully adherent to substrates of Ag, PPA or the like which are otherwise difficult to bond. The semiconductor device encapsulated with the composition in the cured state withstands any rigorous reliability test.

DESCRIPTION OF THE PREFERRED EMBODIMENTS

A. Organopolysiloxane

Figure 1:
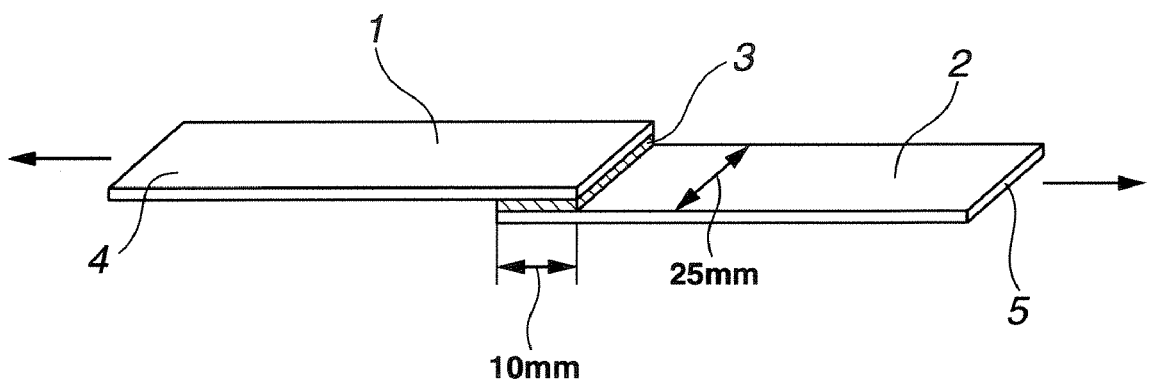
FIG. 1 is a schematic perspective view illustrating a test assembly for measuring the shear bond strength of the compositions of Examples.

Component (A) is a vinyl-containing organopolysiloxane serving as a base component of the inventive composition. It is preferably a generally linear organopolysiloxane containing at least two aliphatic unsaturated bonds, typically alkenyl groups of 2 to 8 carbon atoms, especially 2 to 6 carbon atoms, such as vinyl and allyl groups in a molecule and having a viscosity of 10 to 1,000,000 mPa·s at 25° C., especially 100 to 100,000 mPa·s at 25° C. This linear organopolysiloxane is generally an organopolysiloxane having a backbone consisting of repeating diorganosiloxane units and capped with triorganosiloxy groups at opposite ends of the molecular chain. Preferred from the working and curing standpoints is a linear organopolysiloxane of the general formula (1) containing one to three alkenyl groups on the silicon atom at each end of the molecular chain and also having a viscosity of 10 to 1,000,000 mPa·s at 25° C. as mentioned just above. The linear organopolysiloxane may contain a minor proportion of branched structure or trifunctional siloxane units in the molecular chain.

Note that the viscosity is measured by a rotational viscometer or the like.

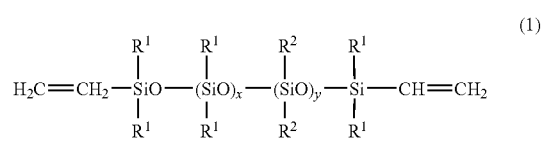

(1)

Herein $R^1$ is each independently a substituted or unsubstituted monovalent hydrocarbon group, $R^2$ is each independently a substituted or unsubstituted monovalent hydrocarbon group free of aliphatic unsaturation, x and y each are 0 or a positive integer, and x+y is such a number that the organopolysiloxane has a viscosity of 10 to 1,000,000 mPa·s at 25° C.

The monovalent hydrocarbon groups represented by $R^1$ are preferably those of 1 to 10 carbon atoms, more preferably 1 to 6 carbon atoms, examples of which include alkyl groups such as methyl, ethyl, propyl, isopropyl, butyl, isobutyl, tert-butyl, pentyl, neopentyl, hexyl, cyclohexyl, octyl, nonyl and decyl, aryl groups such as phenyl, tolyl, xylyl and naphthyl, aralkyl groups such as benzyl, phenylethyl and phenylpropyl, alkenyl groups such as vinyl, allyl, propenyl, isopropenyl, butenyl, hexenyl, cyclohexenyl, and octenyl, and substituted forms of the foregoing groups in which some or all of the hydrogen atoms are substituted with halogen atoms (e.g., fluoro, bromo and chloro), cyano groups or the like, such as halo-substituted alkyl groups, e.g., chloromethyl, chloropropyl, bromoethyl and trifluoropropyl, and cyanoethyl.

The monovalent hydrocarbon groups represented by $R^2$ are preferably those of 1 to 10 carbon atoms, more preferably 1 to 6 carbon atoms, examples of which are as exemplified above for $R^1$, with the proviso that alkenyl groups are excluded.

The subscripts x and y are 0 or positive integers, satisfying $0 < x+y \leq 10{,}000$, preferably positive integers satisfying $5 \leq x+y \leq 2{,}000$ and $0 < x/(x+y) \leq 0.2$.

Illustrative examples of the organopolysiloxane of formula (1) are given below.

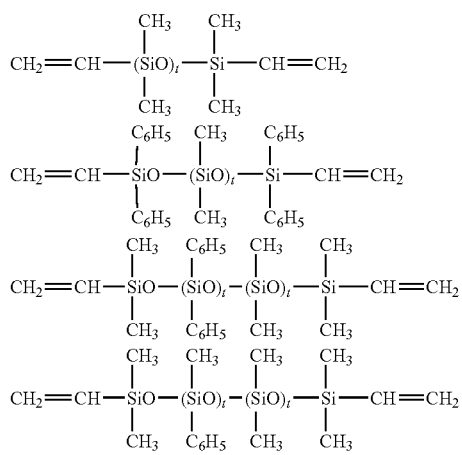

(Subscript t is each independently an integer of 8 to 2,000.)

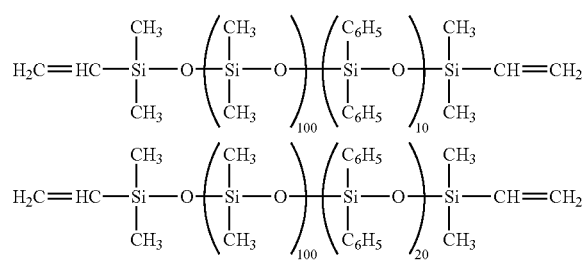

-continued (Subscripts x and y are as defined above.)

In one preferred embodiment of the invention, the organopolysiloxane of formula (1) is used in combination with a second organopolysiloxane of resin structure. The second one is preferably an organopolysiloxane of resin structure or three-dimensional network structure comprising $SiO_2$ units, $R^3{}_k R^4{}_p SiO_{0.5}$ units and $R^3{}_q R^4{}_r SiO_{0.5}$ units wherein $R^3$ is vinyl or allyl, $R^4$ is a monovalent hydrocarbon group free of aliphatic unsaturation, k is 2 or 3, p is 0 or 1, k+p=3, q is 0 or 1, r is 2 or 3, and q+r=3. The monovalent hydrocarbon groups represented by $R^4$ are preferably those of 1 to 10 carbon atoms, more preferably 1 to 6 carbon atoms, as exemplified above for $R^2$.

Provided $SiO_2$, $R^3{}_k R^4{}_p SiO_{0.5}$ and $R^3{}_q R^4{}_r SiO_{0.5}$ units are designated a, b and c units, respectively, they preferably satisfy the relationship:

$(b+c)/a = 0.3$ to 3, especially 0.7 to 1, and $c/a = 0.01$ to 1, especially 0.07 to 0.15, when expressed in molar ratio. Also preferably, the second organopolysiloxane has a weight average molecular weight in the range of 500 to 10,000 as determined by gel permeation chromatography (GPC) using polystyrene standards.

In addition to the a, b and c units, the resin structure organopolysiloxane may further contain difunctional siloxane units and trifunctional siloxane units (i.e., organosilsesquioxane units) in minor amounts that will not compromise the objects of the invention.

The resin structure organopolysiloxane can be synthesized simply by combining compounds, from which the respective units are derived, in amounts to provide the desired molar proportion, and effecting cohydrolysis in the presence of an acid, for example.

Examples of the compound from which "a" units are derived include sodium silicate, alkyl silicates, polyalkyl silicates, and silicon tetrachloride.

Examples of the compound from which "b" units are derived are given below.

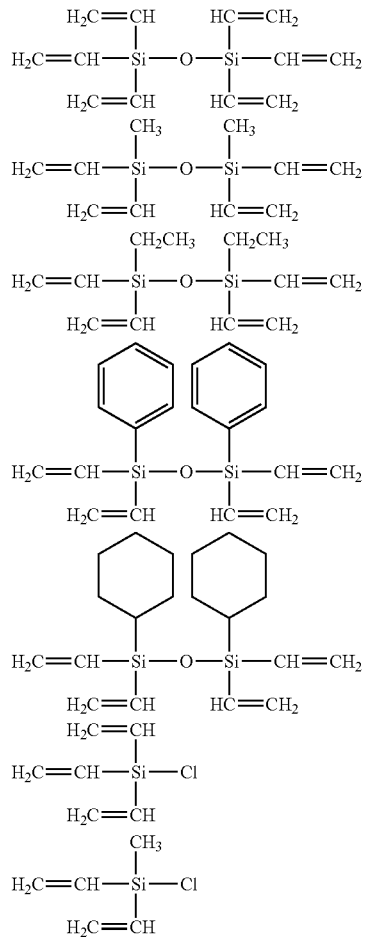

Examples of the compound from which "c" units are derived are given below.

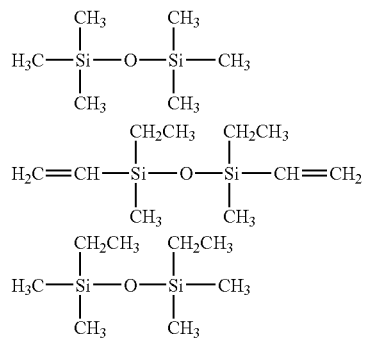

-continued

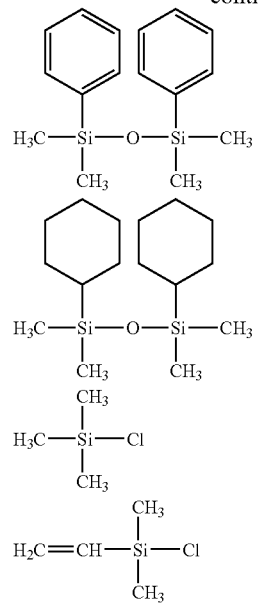

The second organopolysiloxane of resin structure is compounded for the purpose of improving the physical strength and surface tack of a cured composition. The second organopolysiloxane is preferably compounded in an amount of 20 to 70% by weight, more preferably 30 to 60% by weight, based on the weight of component (A). Too less amounts of the second organopolysiloxane fail to achieve the desired effect whereas too much amounts of the second organopolysiloxane result in compositions which have an extremely high viscosity and tend to crack in the cured state.

B. Organohydrogenpolysiloxane

Component (B) is an organohydrogenpolysiloxane which serves as a crosslinking agent for forming a cured product through addition reaction of SiH groups in component (B) to vinyl groups in component (A). Any organohydrogen-polysiloxane may be used as long as it has at least two silicon atom-bonded hydrogen atoms (i.e., SiH groups) in a molecule. Preferred is an organohydrogenpolysiloxane represented by the average compositional formula (2):

$$H_a(R^5)_b SiO_{(4-a-b)/2} \tag{2}$$

wherein $R^5$ is each independently a substituted or unsubstituted monovalent hydrocarbon group free of aliphatic unsaturation, a and b are numbers satisfying $0.001 \leq a < 2$, $0.7 \leq b \leq 2$, and $0.8 \leq a+b \leq 3$, and having at least two (specifically 2 to 300), preferably at least three (specifically 3 to 200) silicon atom-bonded hydrogen atoms (i.e., SiH groups) in a molecule.

In formula (2), $R^5$ is each independently a substituted or unsubstituted monovalent hydrocarbon group free of aliphatic unsaturation, preferably having 1 to 10 carbon atoms, especially 1 to 7 carbon atoms, for example, lower alkyl groups such as methyl, aryl groups such as phenyl, and those exemplified above for $R^2$ in formula (1). The subscripts a and b are numbers satisfying $0.001 \leq a < 2$, $0.7 \leq b \leq 2$, and $0.8 \leq a+b \leq 3$, preferably $0.05 \leq a \leq 1$, $0.8 \leq b \leq 2$, and $1 \leq a+b \leq 2.7$. The position of silicon atom-bonded hydrogen atom is not critical and may be at an end or midway of the molecule.

Examples of the organohydrogenpolysiloxane include tris(dimethylhydrogensiloxy)methylsilane, tris(dimethylhydrogensiloxy)phenylsilane,
1,1,3,3-tetramethyldisiloxane,
1,3,5,7-tetramethylcyclotetrasiloxane,
both end trimethylsiloxy-capped methylhydrogenpolysiloxane,
both end trimethylsiloxy-capped dimethylsiloxane-methylhydrogensiloxane copolymers,
both end dimethylhydrogensiloxy-capped dimethylpolysiloxane,
both end dimethylhydrogensiloxy-capped dimethylsiloxane-methylhydrogensiloxane copolymers,
both end trimethylsiloxy-capped methylhydrogensiloxane-diphenylsiloxane copolymers,
both end trimethylsiloxy-capped methylhydrogensiloxane-diphenylsiloxane-dimethylsiloxane copolymers,
copolymers consisting of $(CH_3)_2HSiO_{1/2}$ units and $SiO_{4/2}$ units,
and copolymers consisting of $(CH_3)_2HSiO_{1/2}$ units, $SiO_{4/2}$ units and $(C_6H_5)SiO_{3/2}$ units.

Also useful are compounds of the following structures.

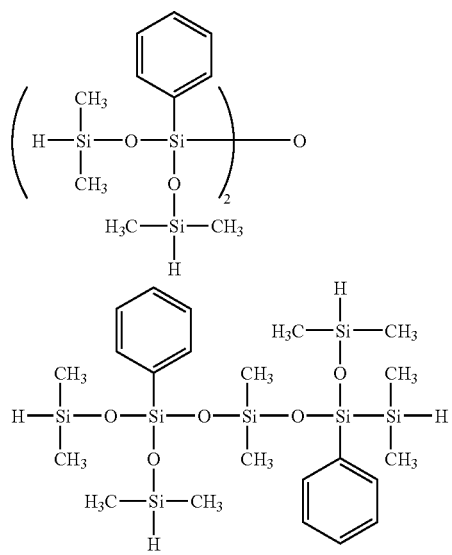

The molecular structure of the organohydrogen-polysiloxane may be either straight, branched, cyclic or three-dimensional network. The number of silicon atoms per molecule, i.e., degree of polymerization is preferably in the range of about 3 to about 1,000, more preferably about 3 to about 300.

The organohydrogenpolysiloxane can be obtained by hydrolysis of a chlorosilane such as $R^5SiHCl_2$, $(R^5)_3SiCl$, $(R^5)_2SiCl_2$ or $(R^5)_2SiHCl$ wherein $R^5$ is as defined above, and optionally equilibrating the siloxane resulting from hydrolysis.

The organohydrogenpolysiloxane (B) is compounded in an effective amount to induce curing of component (A). Preferably component (B) is used in such amounts that the molar ratio of SiH groups in component (B) to the total of alkenyl groups (typically vinyl groups) in component (A) is from 0.1 to 4.0, more preferably from 1.0 to 3.0, most preferably from 1.2 to 2.8. A molar ratio of less than 0.1 may be insufficient for curing reaction to proceed, making it difficult to obtain cured silicone rubber. At a molar ratio in excess of 4.0, a substantial amount of unreacted SiH groups may be left in the cured composition which will change its rubber physical properties with the passage of time.

C. Aluminum Metal Based Polymerization Catalyst

Component (C) is an aluminum metal based polymerization catalyst which catalyzes polymerization of functional groups such as epoxy and alkoxy groups in the tackifier to be described later. Examples of the aluminum metal based polymerization catalyst include aluminum trihydroxide, and organic aluminum compounds such as aluminum alcoholates, aluminum acylates, aluminum acylate salts, aluminosiloxy compounds and aluminum chelates. Of these, aluminum chelates are preferred.

The catalysts of aluminum chelates which can be used herein are commercially available, for example, as ACS and Chelope EB-2 from Hope Chemical Co., Ltd.

The aluminum metal based polymerization catalyst is compounded in a catalytic amount, and desirably in an amount of 0.005 to 10% by weight, more desirably 0.05 to 2% by weight based on the total weight of components (A) and (E). Less than 0.005 wt % may fail to achieve the desired effect whereas more than 10 wt % can alter the properties (hardness, outer appearance, etc.) of cured resin.

D. Platinum Group Metal Catalyst

This catalyst component is compounded for inducing addition cure reaction to the inventive composition. Platinum, palladium and rhodium base catalysts are included. Of these, platinum base catalysts such as platinum, platinum black and chloroplatinic acid are preferred from the economical standpoint. Specific examples include $H_2PtCl_6 \cdot mH_2O$, $K_2PtCl_6$, $KHPtCl_6 \cdot mH_2O$, $K_2PtCl_4$, $K_2PtCl_4 \cdot mH_2O$, and $PtO_2 \cdot mH_2O$ wherein m is a positive integer, and complexes thereof with hydrocarbons such as olefins, alcohols and vinyl-containing organopolysiloxanes. They may be used alone or in admixture.

The catalyst may be used in a catalytic amount, specifically in an amount to give about 0.1 to 1,000 ppm, preferably about 0.5 to 200 ppm of platinum group metal based on the weight of components (A) and (B) combined.

E. Tackifier

In the inventive composition, (E) a tackifier (or an adhesive agent) is added for improving the adhesion of the cured composition. As the tackifier, preference is given to linear or cyclic organosiloxane oligomers of about 4 to 50 silicon atoms, preferably about 4 to 20 silicon atoms, having per molecule at least two, preferably two or three functional groups selected from among silicon-bonded hydrogen atoms (i.e., SiH), silicon-bonded alkenyl groups (e.g., Si—CH=CH$_2$), alkoxysilyl groups (e.g., trimethoxysilyl) and epoxy groups (e.g., glycidoxypropyl, 3,4-epoxycyclohexylethyl).

Organoxysilyl-modified isocyanurate compounds having the general formula (3) and/or hydrolytic condensates thereof (i.e., organosiloxane-modified isocyanurate compounds) are also useful tackifiers.

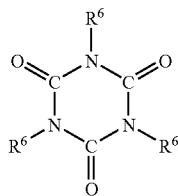
(3)

Herein R⁶ is an organic group having the formula (4):

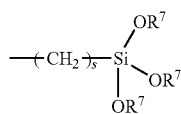
(4)

or a monovalent hydrocarbon group containing an aliphatic unsaturated bond, at least one of $R^6$ is an organic group of formula (4), $R^7$ is hydrogen or a monovalent hydrocarbon group of 1 to 6 carbon atoms, and s is an integer of 1 to 6, especially 1 to 4.

Examples of the monovalent hydrocarbon group containing an aliphatic unsaturated bond, represented by $R^6$, include alkenyl groups of 2 to 8 carbon atoms, especially 2 to 6 carbon atoms, such as vinyl, allyl, propenyl, isopropenyl, butenyl, isobutenyl, pentenyl, hexenyl, and cyclohexenyl. The monovalent hydrocarbon groups represented by $R^7$ include those of 1 to 8 carbon atoms, preferably 1 to 6 carbon atoms, for example, alkyl groups such as methyl, ethyl, propyl, isopropyl, butyl, isobutyl, tert-butyl, pentyl, hexyl and cyclohexyl, alkenyl groups such as vinyl, allyl, propenyl and isopropenyl as exemplified above for $R^6$, and aryl groups such as phenyl. Of these, alkyl groups are preferred.

Illustrative examples of the tackifier (E) are given below.

(Subscripts g and h are positive integers satisfying g+h=2 to 50, preferably 4 to 20.)

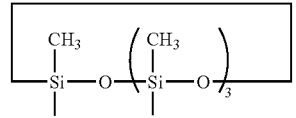

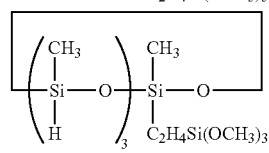

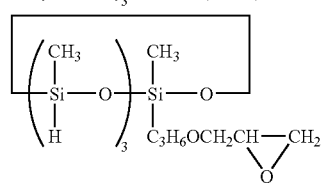

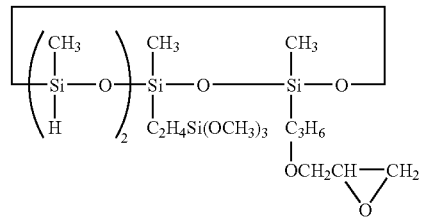

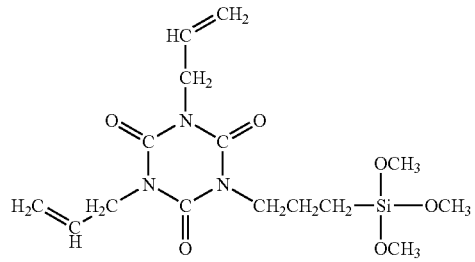

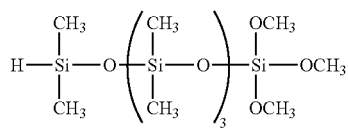

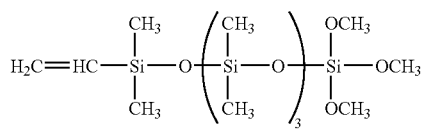

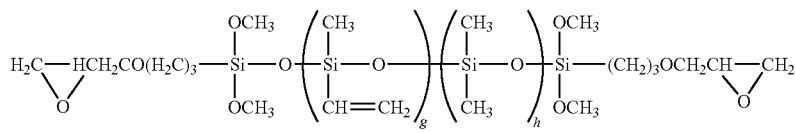

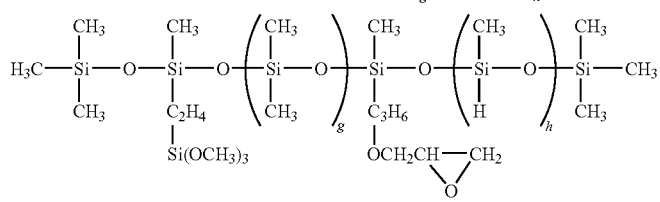

-continued

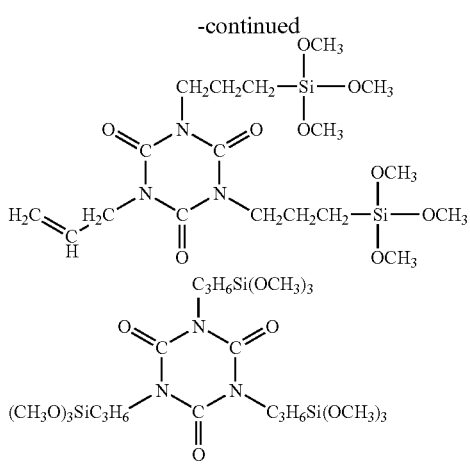

Of the organosilicon compounds as tackifier (E), those organosilicon compounds having silicon atom-bonded alkoxy groups and alkenyl groups or silicon atom-bonded hydrogen atoms (i.e., SiH) in a molecule are preferred because the cured compositions are more adhesive.

The tackifier (E) is included in an effective amount of less than or equal to 10 parts by weight, specifically about 0.01 to 10 parts by weight, preferably about 0.01 to 5 parts by weight, more preferably about 0.1 to 1 part by weight, per 100 parts by weight of component (A). Too less amounts of component (E) may fail to enhance the adhesion to substrates whereas too much amounts of component (E) may adversely affect the hardness and surface tack of a cured composition.

In addition to components (A) to (E), the inventive composition may further contain per se known various additives, if necessary. Suitable additives include reinforcing inorganic fillers such as fumed silica and fumed titanium dioxide, and non-reinforcing inorganic fillers such as calcium carbonate, calcium silicate, titanium dioxide, ferric oxide, carbon black and zinc oxide. These additives may be added in suitable amounts as long as this does not compromise the objects of the invention.

The silicone rubber composition of the invention is prepared by intimately mixing the components. Most often, the composition is shelf stored in two divided form so as to prohibit the progress of cure. On use, two parts are mixed together whereupon cure takes place. It is, of course, possible to formulate a one-part composition by adding minor amounts of reaction inhibitors such as acetylene alcohols to the composition. In the case of two-part type, component (B) should be separated from component (C) to avoid the risk of dehydrogenation reaction. The silicone rubber composition thus obtained should preferably have a viscosity of about 100 to about 10,000,000 mPa·s at 25° C., especially about 300 to about 500,000 mPa·s at 25° C., as measured by a rotational viscometer.

The inventive composition quickly cures, if necessary, by heating, to form a part which is highly transparent and fully adherent to package materials such as LCP and metal substrates. Thus the composition is useful in various applications, typically as semiconductor packages including LED's, photo-diodes, CCD's and CMOS's.

The curing conditions are not particularly limited. Usually the composition can be cured by heating at about 40 to 250° C., preferably about 60 to 200° C. for about 5 minutes to 10 hours, preferably about 30 minutes to 6 hours.

EXAMPLE

Examples of the invention are given below by way of illustration and not by way of limitation. All parts are by weight, and Vi is vinyl.

Example 1

A silicone rubber composition was prepared by combining 50 parts of a polysiloxane (VF) having formula (i), 50 parts of a resin structure vinylmethylsiloxane (VMQ) consisting of 50 mol % $SiO_2$ units, 42.5 mol % $(CH_3)_3SiO_{0.5}$ units and 7.5 mol % $Vi_3SiO_{0.5}$ units, an organohydrogenpolysiloxane having formula (ii) in an amount to give 1.5 mol of SiH groups per mol of total vinyl groups in the VF and VMQ components, 0.05 part of an octyl alcohol-modified chloroplatinic acid solution, 0.1 part of an aluminum chelate catalyst ACS (Hope Chemical Co., Ltd.), and 1 part of a tackifier having formula (iii) and intimately mixing them.

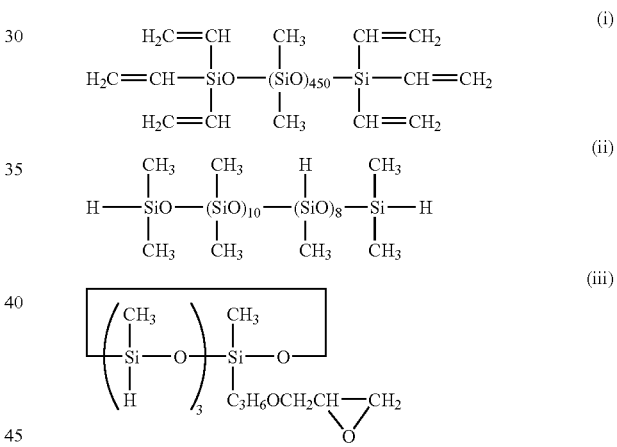

The composition was heat molded at 150° C. for 4 hours to form a cured sample, which was visually observed for outer appearance. The sample was also measured for tensile strength, hardness (by Type A spring tester) and elongation according to JIS K-6301.

Additionally, shear bond strength to PPA and percent cohesive failure were determined by the following tests.

PPA Shear Bond Strength Test

As shown in FIG. 1, two 25-mm wide rectangular pieces of PPA (polyphthalamide resin) 1 and 2 were lap-jointed over a distance of 10 mm while a 1-mm thick layer 3 of the silicone rubber composition (prepared above) intervened therebetween. The test assembly was heated at 150° C. for 4 hours for curing the composition layer 3 and then held at room temperature over 12 hours. Using a tensile tester, the free ends 4 and 5 of the test assembly were pulled apart in longitudinal directions as shown by arrows, for determining a tensile shear bond strength.

Cohesive Failure Test

The fracture section of the test assembly after the shear bond strength measurement was observed. A percentage of areas where cohesive failure occurred (the silicone rubber itself failed rather than interfacial peeling between PPA and silicone rubber) relative to the overall area of the fracture section was calculated and reported as percent cohesive failure.

The results are shown in Table 1.

Reflow Test

Figure 2:
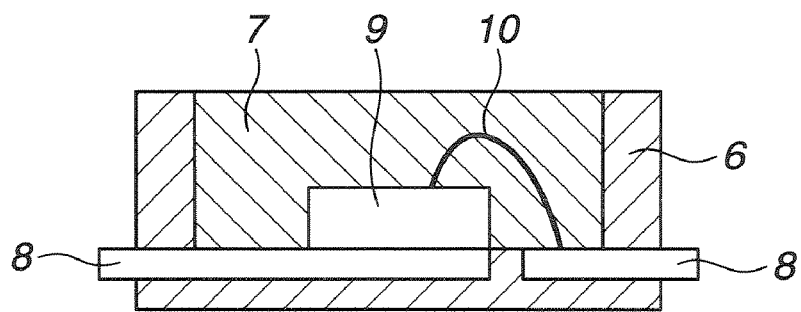
FIG. 2 is a schematic cross section of a package used in a moistened reflow test.

As shown in FIG. 2, a dummy package made of PPA was filled with the silicone rubber composition, which was cured by heating at 150° C. for 4 hours. Depicted in FIG. 2 are a package 6 made of polyphhalamide resin Amodel®, a silver-plated lead frame 8 disposed in the package 6, and a chip 9 connected to the lead frame 8 by a wire 10. The silicone rubber composition 7 is charged and cured in the package 6 for encapsulating the chip 9 and wire 10.

The package was subjected to a moistened reflow test according to MSL Level 2. Specifically, according to the MSL test method, the package was conditioned by holding in a 60° C./90% RH atmosphere for 16 hours for moisture absorption. The fully moistened package was repeatedly passed through an IR reflow furnace at 260° C., whereupon it was visually inspected for separation and cracks. The results are shown in Table 3. For each Example, 20 samples were tested.

Example 2

A composition was prepared and tested as in Example 1 except that 0.5 part of the aluminum chelate catalyst ACS was used. The results are shown in Tables 1 and 3.

Example 3

A composition was prepared and tested as in Example 1 except that 0.5 part of Chelope EB-2 (Hope Chemical Co., Ltd.) was used as the aluminum chelate catalyst. The results are shown in Tables 1 and 3.

Example 4

A composition was prepared and tested as in Example 1 except that 0.5 part of a compound of the formula shown below was used as the tackifier. The results are shown in Tables 1 and 3.

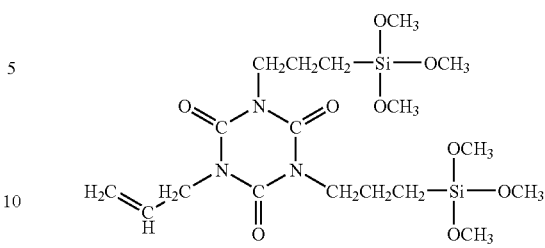

Example 5

A composition was prepared and tested as in Example 1 except that 1.0 part of a compound of the formula shown below was used as the tackifier. The results are shown in Tables 1 and 3.

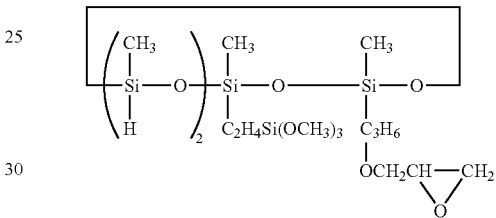

Comparative Example 1

A composition was prepared and tested as in Example 1 except that the aluminum chelate catalyst ACS was omitted. The results are shown in Tables 2 and 3.

Comparative Example 2

A composition was prepared and tested as in Example 4 except that the aluminum chelate catalyst ACS was omitted. The results are shown in Tables 2 and 3.

TABLE 1

| | Example | | | | |
|---|---|---|---|---|---|
| | 1 | 2 | 3 | 4 | 5 |
| SiH/SiVi | 1.5 | 1.5 | 1.5 | 1.5 | 1.5 |
| Appearance | colorless, transparent | colorless, transparent | colorless, transparent | colorless, transparent | colorless, transparent |
| Curing conditions | 150° C./4 hr | 150° C./4 hr | 150° C./4 hr | 150° C./4 hr | 150° C./4 hr |
| Hardness (Type A) | 70 | 71 | 70 | 70 | 70 |
| Elongation (%) | 30 | 30 | 30 | 30 | 20 |
| Tensile strength (MPa) | 7 | 7 | 7 | 8 | 7 |
| PPA shear bond strength (MPa) | 5 | 4 | 5 | 6 | 6 |
| Cohesive failure (%) | 80 | 80 | 90 | 100 | 100 |

TABLE 2

|  | Comparative Example | |
|---|---|---|
|  | 1 | 2 |
| SiH/SiVi | 1.5 | 1.5 |
| Appearance | colorless, transparent | colorless, transparent |
| Curing conditions | 150° C./4 hr | 150° C./4 hr |
| Hardness (Type A) | 70 | 72 |
| Elongation (%) | 30 | 30 |
| Tensile strength (MPa) | 6 | 7 |
| PPA shear bond strength (MPa) | 2 | 2 |
| Cohesive failure (%) | 50 | 30 |

TABLE 3

|  | Example | | | | | Comparative Example | |
|---|---|---|---|---|---|---|---|
|  | 1 | 2 | 3 | 4 | 5 | 1 | 2 |
| As cured | 0 | 0 | 0 | 0 | 0 | 0 | 0 |
| As moistened | 0 | 0 | 0 | 0 | 0 | 10 | 5 |
| 260° C. reflow/1 pass | 0 | 0 | 0 | 0 | 0 | 80 | 80 |
| 260° C. reflow/2 passes | 0 | 0 | 0 | 0 | 0 | 100 | 100 |
| 260° C. reflow/3 passes | 0 | 0 | 0 | 0 | 0 |  |  |
| 260° C. reflow/4 passes | 0 | 0 | 0 | 0 | 0 |  |  |
| 260° C. reflow/5 passes | 0 | 0 | 0 | 0 | 0 |  |  | n = 20

Japanese Patent Application No. 2005-155797 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A curable silicone rubber composition comprising
(A) a vinyl-containing organopolysiloxane,
(B) an organohydrogenpolysiloxane,
(C) an aluminum metal based polymerization catalyst,
(D) a platinum group metal based catalyst, and
(E) a tackifier, wherein
said component (A) comprises
a first organopolysiloxane having a viscosity of 10 to 1,000,000 mPa·s at 25° C., said first organopolysiloxane being represented by formula (a), (b), (c), or (d):

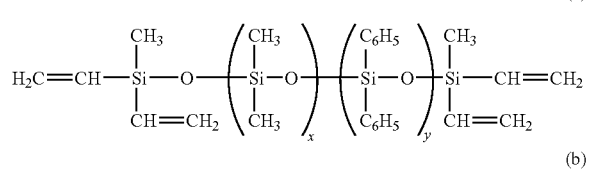

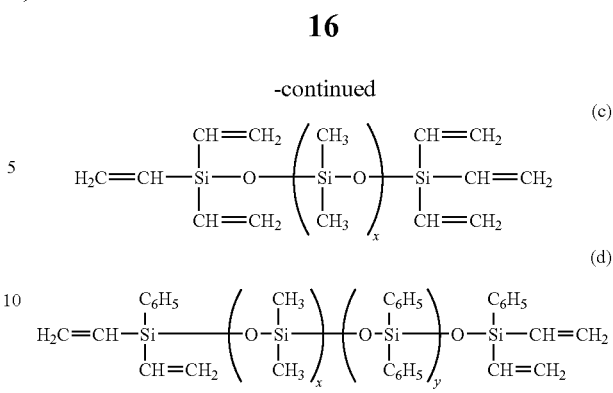

wherein each x and y is 0 or a positive integer, and the sum of x+y is such a number that the organopolysiloxane has a viscosity of 10 to 1,000,000 mPa·s at 25° C., and a second organopolysiloxane of resin structure comprising $SiO_2$ units, $R^3_k R^4_p SiO_{0.5}$ units and $R^3_q R^4_r SiO_{0.5}$ units wherein $R^3$ is vinyl or allyl, $R^4$ is an aliphatic unsaturation-free monovalent hydrocarbon group, k is 2 or 3, p is 0 or 1, k+p=3, q is 0 or 1, r is 2 or 3, q+r=3, said second organopolysiloxane being present in an amount of 20 to 70% by weight based on the weight of component (A), said component (E) is a linear or cyclic organosiloxane oligomer of 4 to 50 silicon atoms having at least two functional groups selected from the class consisting of silicon-bonded hydrogen atoms, alkoxysilyl groups, and epoxy groups, or an isocyanurate compound represented by formula (3):

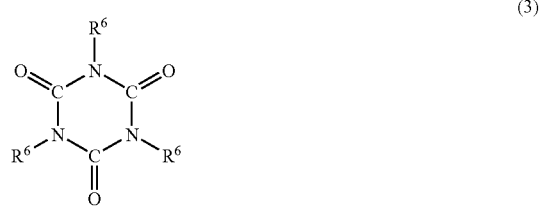

wherein $R^6$ is an organic group represented by formula (4):

or an aliphatic unsaturation-containing monovalent hydrocarbon group, at least one of $R^6$ is an organic group of formula (4), $R^7$ is hydrogen or a monovalent hydrocarbon group of 1 to 6 carbon atoms, and s is an integer of 1 to 6, or a hydrolytic condensate thereof or both, and wherein a cured product of the silicone rubber composition has an elongation of 20 to 30% according to JIS K-6301.

2. The composition of claim 1 wherein component (C) is an aluminum chelate.

3. A semiconductor device encapsulated with the composition of claim 2 in the cured state.

4. A semiconductor device encapsulated with the composition of claim 1 in the cured state.

5. The composition of claim 1, wherein:
component (D) is selected from the group consisting of platinum, platinum black, chloroplatinic acid, and mixtures thereof.

6. A semiconductor device encapsulated with the composition of claim 5 in the cured state.

7. The composition of claim 1, wherein:
component (D) is one or more members selected from the group consisting of $H_2PtCl_6 \cdot mH_2O$, $K_2PtCl_6$, $KHPtCl_6 \cdot mH_2O$, $K_2PtCl_4$, $K_2PtCl_4 \cdot mH_2O$, and $PtO_2 \cdot mH_2O$ wherein m is a positive integer, and complexes thereof with olefins, alcohols and vinyl-containing organopolysiloxanes.

8. A semiconductor device encapsulated with the composition of claim 7 in the cured state.

9. The composition of claim 1, wherein:
component (C) is an aluminum chelate; and
component (E) is a linear or cyclic organosiloxane oligomer of 4 to 50 silicon atoms having at least two functional groups selected from the class consisting of silicon-bonded hydrogen atoms, alkoxysilyl groups, and epoxy groups.

10. A semiconductor device encapsulated with the composition of claim 9 in the cured state.

11. The composition of claim 1, wherein:
component (C) is an aluminum chelate; and
component (E) is an isocyanurate compound having the general formula (3):

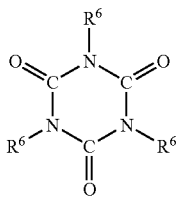

(3)

wherein $R^6$ is an organic group having the formula (4):

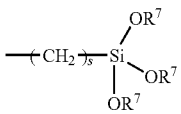

(4)

or an aliphatic unsaturation-containing monovalent hydrocarbon group, at least one of $R^6$ is an organic group of formula (4), $R^7$ is hydrogen or a monovalent hydrocarbon group of 1 to 6 carbon atoms, and s is an integer of 1 to 6, or a hydrolytic condensate thereof or both.

12. A semiconductor device encapsulated with the composition of claim 11 in the cured state.

13. The composition of claim 1, wherein:
component (B) is an organohydrogenpolysiloxane represented by the average compositional formula (2):

(2)

wherein each $R^5$ is independently a substituted or unsubstituted monovalent hydrocarbon group free of aliphatic unsaturation, a and b are numbers satisfying $0.001 \leq a \leq 2$, $0.7 \leq b \leq 2$, and $0.8 \leq a+b \leq 3$, and having at least two silicon atom-bonded hydrogen atoms in a molecule.

14. A semiconductor device encapsulated with the composition of claim 13 in the cured state.

15. The composition of claim 1, wherein:
component (B) is an organohydrogenpolysiloxane represented by the average compositional formula (2):

$H_a(R^5)_b SiO_{(4-a-b)/2}$ (2)

wherein each $R^5$ is independently a substituted or unsubstituted monovalent hydrocarbon group free of aliphatic unsaturation, a and b are numbers satisfying $0.001 \leq a < 2$, $0.7 \leq b \leq 2$, and $0.8 \leq a+b \leq 3$, and having at least two silicon atom-bonded hydrogen atoms in a molecule;
component (C) is an aluminum chelate;
component (D) is selected from the group consisting of platinum, platinum black, chloroplatinic acid, and mixtures thereof, and
component (E) is an isocyanurate compound having the general formula (3):

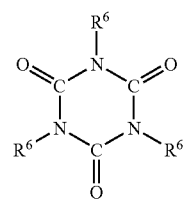

(3)

wherein $R^6$ is an organic group having the formula (4):

(4)

or an aliphatic unsaturation-containing monovalent hydrocarbon group, at least one of $R^6$ is an organic group of formula (4), $R^7$ is hydrogen or a monovalent hydrocarbon group of 1 to 6 carbon atoms, and s is an integer of 1 to 6, or a hydrolytic condensate thereof or both.

16. A semiconductor device encapsulated with the composition of claim 15 in the cured state.

17. The composition of claim 1, wherein:
component (B) is an organohydrogenpolysiloxane represented by the average compositional formula (2):

(2)

wherein each $R^5$ is independently a substituted or unsubstituted monovalent hydrocarbon group free of aliphatic unsaturation, a and b are numbers satisfying $0.001 \leq a < 2$, $0.7 \leq b \leq 2$, and $0.8 \leq a+b \leq 3$, and having at least two silicon atom-bonded hydrogen atoms in a molecule;
component (C) is an aluminum chelate;
component (D) is one or more members selected from the group consisting of $H_2PtCl_6 \cdot mH_2O$, $K_2PtCl_6$, $KHPtCl_6 \cdot mH_2O$, $K_2PtCl_4$, $K_2PtCl_4 \cdot mH_2O$, and $PtO_2 \cdot mH_2O$ wherein m is a positive integer, and complexes thereof with olefins, alcohols and vinyl-containing organopolysiloxanes; and
component (E) is an isocyanurate compound having the formula (3):

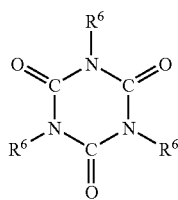

wherein R⁶ is an organic group having the formula (4):

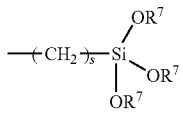

or an aliphatic unsaturation-containing monovalent hydrocarbon group, at least one of R⁶ is an organic group of formula (4), $R^7$ is hydrogen or a monovalent hydrocarbon group of 1 to 6 carbon atoms, and s is an integer of 1 to 6, or a hydrolytic condensate thereof or both.

18. A semiconductor device encapsulated with the composition of claim 17 in the cured state.

19. The composition of claim 1, wherein the said organopolysiloxane is represented by formula (b) or (c):

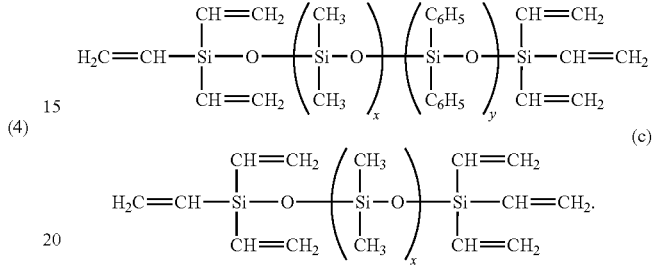

* * * * *